(12) United States Patent
Hargreaves

(10) Patent No.: US 8,884,635 B2
(45) Date of Patent: Nov. 11, 2014

(54) TRANSCAPACITIVE CHARGE MEASUREMENT

(75) Inventor: Kirk Hargreaves, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 330 days.

(21) Appl. No.: 13/486,860

(22) Filed: Jun. 1, 2012

(65) Prior Publication Data

US 2013/0321005 A1 Dec. 5, 2013

(51) Int. Cl.
*G01R 27/26* (2006.01)

(52) U.S. Cl.
USPC ........... 324/679; 324/658; 345/173; 345/174; 365/148

(58) Field of Classification Search
CPC ................................ G01R 27/26; G06F 3/044
USPC .......................................................... 324/679
See application file for complete search history.

(56) References Cited

U.S. PATENT DOCUMENTS

| | | | | |
|---|---|---|---|---|
| 4,199,984 A * | 4/1980 | Huddart et al. | ............. | 73/304 C |
| 7,577,044 B2 | 8/2009 | Baker | | |
| 8,207,944 B2 * | 6/2012 | Geaghan | ........................ | 345/173 |
| 8,259,086 B2 | 9/2012 | Agari et al. | | |
| 8,259,087 B2 | 9/2012 | Chen et al. | | |
| 8,441,834 B2 | 5/2013 | Baker | | |
| 8,547,117 B2 | 10/2013 | Yoshikawa | | |
| 8,599,169 B2 | 12/2013 | Nascimento | | |
| 2004/0095264 A1 * | 5/2004 | Thomas | ........................... | 341/53 |
| 2008/0192530 A1 * | 8/2008 | Baker | ........................... | 365/148 |
| 2008/0295603 A1 | 12/2008 | Shin et al. | | |
| 2009/0152022 A1 | 6/2009 | Jung et al. | | |
| 2009/0279345 A1 * | 11/2009 | Baker | ........................... | 365/148 |
| 2010/0072916 A1 | 3/2010 | Shin et al. | | |
| 2010/0188359 A1 | 7/2010 | Lee | | |
| 2010/0188360 A1 | 7/2010 | Joung et al. | | |
| 2010/0212975 A1 * | 8/2010 | Moon et al. | ................. | 178/18.06 |
| 2010/0253647 A1 * | 10/2010 | Agari et al. | .................... | 345/174 |
| 2010/0277433 A1 | 11/2010 | Lee et al. | | |
| 2011/0025635 A1 | 2/2011 | Lee | | |
| 2011/0037727 A1 | 2/2011 | Lee et al. | | |
| 2011/0050638 A1 | 3/2011 | Lee | | |
| 2011/0102353 A1 * | 5/2011 | Kim et al. | ...................... | 345/173 |
| 2011/0186359 A1 * | 8/2011 | Chen et al. | .................. | 178/18.06 |
| 2011/0199327 A1 | 8/2011 | Shin et al. | | |
| 2011/0210934 A1 | 9/2011 | Lee et al. | | |
| 2012/0019266 A1 * | 1/2012 | Yoshikawa | ..................... | 324/679 |
| 2012/0025847 A1 * | 2/2012 | Andre | ............................ | 324/612 |
| 2012/0268142 A1 * | 10/2012 | Kremin et al. | ................. | 324/658 |
| 2013/0063164 A1 * | 3/2013 | Hall et al. | ...................... | 324/679 |
| 2013/0154992 A1 * | 6/2013 | Nascimento | ................... | 345/174 |

* cited by examiner

*Primary Examiner* — Benjamin M Baldridge

(57) ABSTRACT

A circuit for measuring a change in capacitive coupling between a transmitter electrode and receiver electrode includes a transmitter module that couples with the transmitter electrode and drives it with a plurality of positive and negative measurement cycles. A latched comparator has an input and an output, where the input couples with the receiver electrode. Upon enablement, the latched comparator determines if receiver electrode voltages satisfy an input threshold of the latched comparator and provides an output signal from an output based on this determination. A first counter is adjusted based on a first output signal of the latched comparator output during a positive measurement cycle. A second counter is adjusted based on a second output signal of the latched comparator during a negative measurement cycle. Measurement of change in capacitive coupling between the transmitter electrode and receiver electrode is based on counter values of the first and second counters.

20 Claims, 10 Drawing Sheets

TRANSCAPACITIVE CHARGE MEASUREMENT

CROSS-REFERENCE TO RELATED U.S. PATENT APPLICATIONS

This Application is related to U.S. patent application Ser. No. 13/487,063 by Kirk Hargreaves, filed on 1 Jun. 2012, entitled "CAPACITIVE CHARGE MEASUREMENT", and assigned to the assignee of the present invention. To the extent not repeated herein, the contents of this related patent application are hereby incorporated herein by reference.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic device.

SUMMARY

A circuit for measuring a change in capacitive coupling between a transmitter electrode and receiver electrode includes a transmitter module that couples with the transmitter electrode and drives it with a plurality of positive and negative measurement cycles. A latched comparator has an input and an output, where the input couples with the receiver electrode. Upon enablement, the latched comparator determines if receiver electrode voltages satisfy an input threshold of the latched comparator and provides an output signal from an output based on this determination. A first counter is adjusted based on a first output signal of the latched comparator output during a positive measurement cycle. A second counter is adjusted based on a second output signal of the latched comparator during a negative measurement cycle. Measurement of change in capacitive coupling between the transmitter electrode and receiver electrode is based on counter values of the first and second counters.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements, and.

DESCRIPTION OF EMBODIMENTS

The following Description of Embodiments is merely provided by way of example and not of limitation. Furthermore, there is no intention to be bound by any expressed or implied theory presented in the preceding technical field, background, brief summary or the following detailed description.

Various embodiments provide input devices, circuits, and methods that facilitate improved usability.

Figure 1:
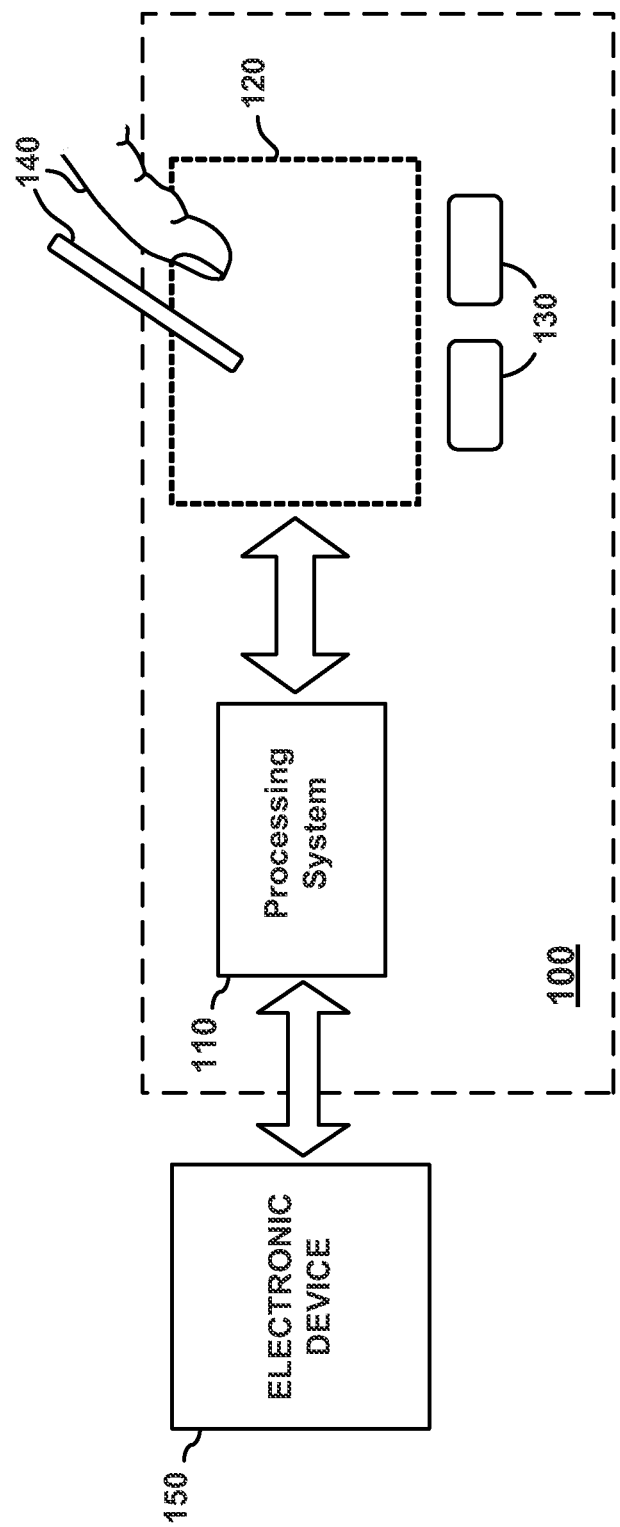
FIG. 1 is a block diagram of an example input device, in accordance with embodiments.

Turning now to the figures, FIG. 1 is a block diagram of an exemplary input device 100, in accordance with various embodiments. Input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

Input device 100 can be implemented as a physical part of the electronic system, or can be physically separate from the electronic system. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near input device 100 in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g. to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active area of a display screen. For example, input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Figure 2:
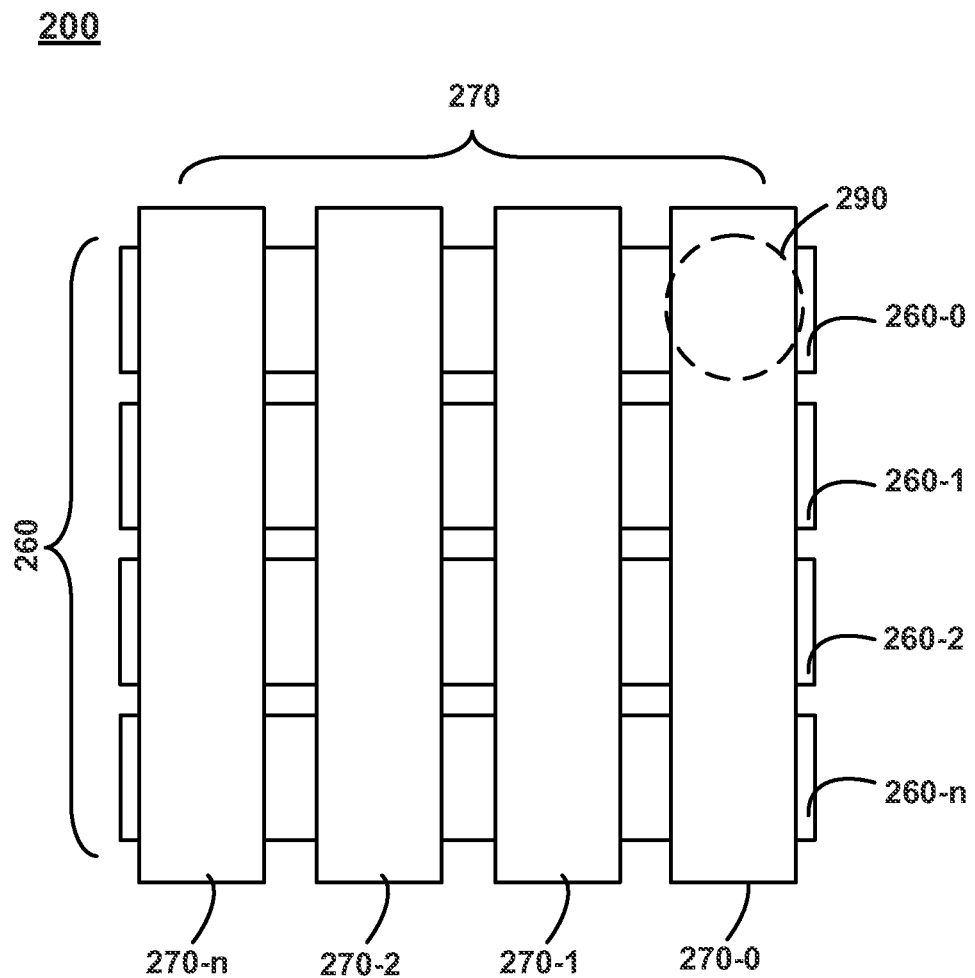
FIG. 2 shows a portion of an example sensor electrode pattern which may be utilized in a sensor to generate all or part of the sensing region of an input device, such as a touch screen, according to some embodiments.

FIG. 2 shows a portion of an example sensor electrode pattern 200 which may be utilized in a sensor to generate all or part of the sensing region of a input device 100, according to various embodiments. Input device 100 is configured as a capacitive input device when utilized with a capacitive sensor electrode pattern. For purposes of clarity of illustration and description, a non-limiting simple rectangular sensor electrode pattern 200 is illustrated. It is appreciated that numerous other sensor electrode patterns may be employed. The illustrated sensor electrode pattern is made up of a plurality of receiver electrodes 270 (270-0, 270-1, 270-2 . . . 270-$n$) and a plurality of transmitter electrodes 260 (260-0, 260-1, 260-2 . . . 260-$n$) which overlay one another, in this example. In the illustrated example, touch sensing pixels are centered at locations where transmitter and receiver electrodes cross. Capacitive pixel 290 illustrates one of the capacitive pixels generated by sensor electrode pattern 200. It is appreciated that in a crossing sensor electrode pattern, such as the illustrated example, some form of insulating material or substrate is typically disposed between transmitter electrodes 260 and receiver electrodes 270. However, in some embodiments, transmitter electrodes 260 and receiver electrodes 270 may be disposed on the same layer as one another through use of routing techniques and/or jumpers. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

Capacitive pixels, such as capacitive pixel 290, are areas of localized capacitive coupling between transmitter electrodes 260 and receiver electrodes 270. The capacitive coupling between transmitter electrodes 260 and receiver electrodes 270 changes with the proximity and motion of input objects in the sensing region associated with transmitter electrodes 260 and receiver electrodes 270.

In some embodiments, sensor electrode pattern 200 is "scanned" to determine these capacitive couplings. That is, the transmitter electrodes 260 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 270 to be independently determined.

The receiver electrodes 270 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

Example Capacitive Charge Measuring Circuits

Figure 3:
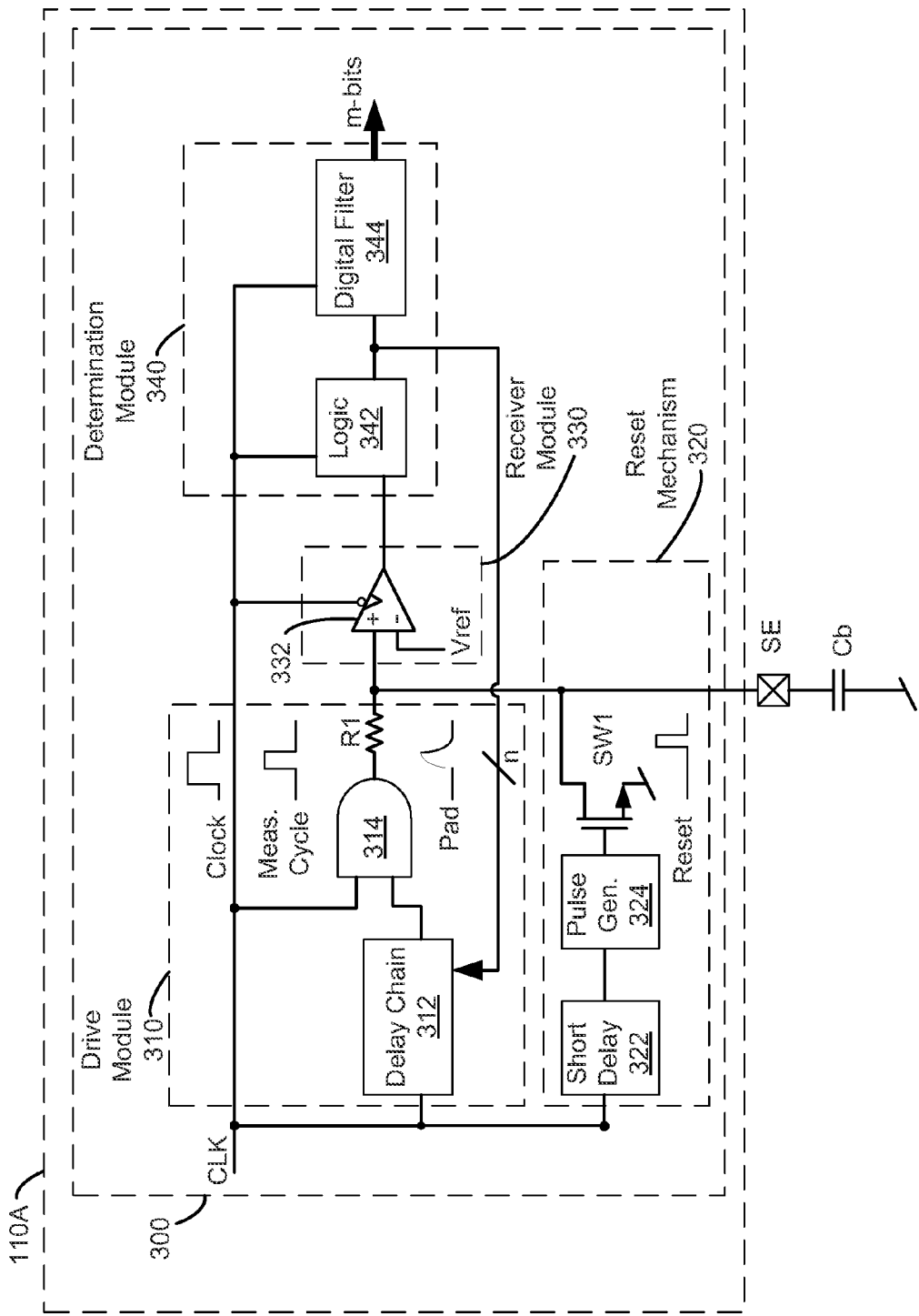
FIG. 3 shows a processing system with a capacitive charge measuring circuit, according to some embodiments.

FIG. 3 shows processing system 110A with a capacitive charge measuring circuit 300, according to some embodiments. Processing system 110A of FIG. 3, may be utilized with electronic device 100 of FIG. 1 to form a capacitive input device, and may be coupled with one or a plurality of sensor electrodes, such as, for example, the sensor electrodes illustrated in FIG. 2. As illustrated in FIG. 3, capacitive charge measuring circuit 300 includes a drive module 310, a reset mechanism 320, a receiver module 330, and a determination module 340.

Figure 4:
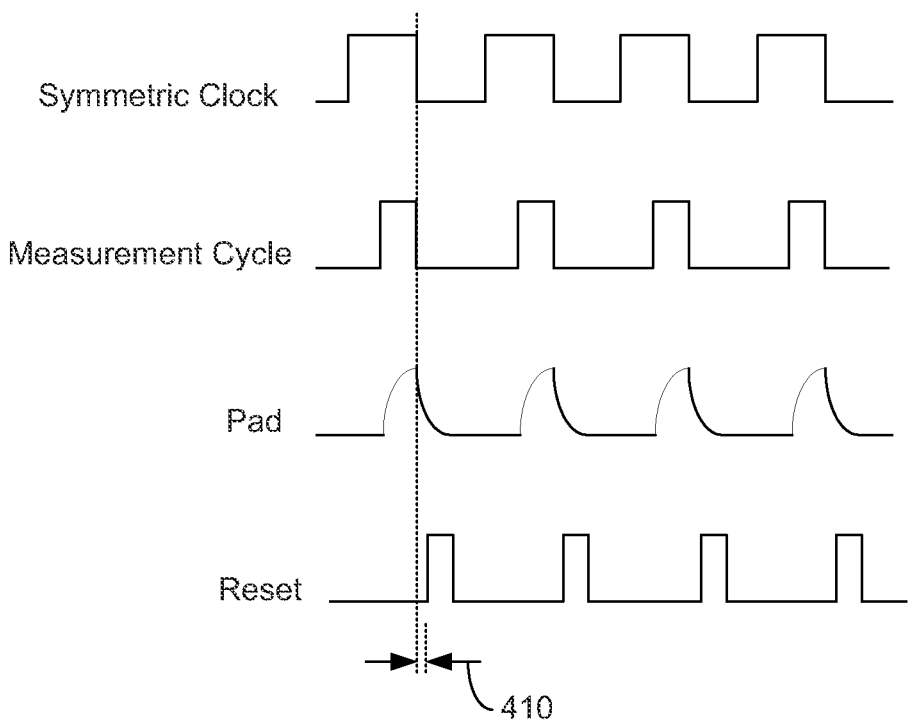
FIG. 4 illustrates a timing diagram for operation of the capacitive charge measurement circuit of FIG. 3 with a symmetric clock signal, according to an embodiment.
Figure 5:
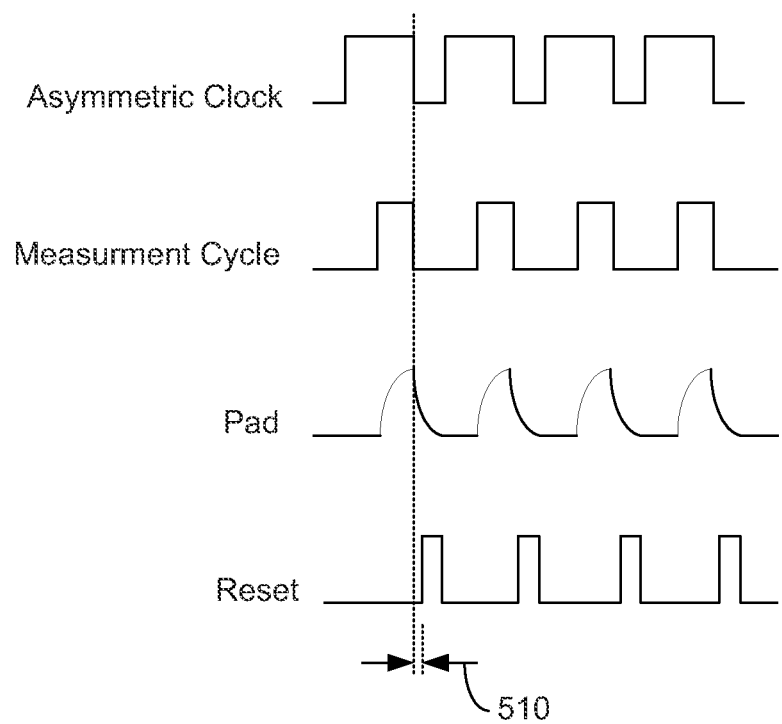
FIG. 5 illustrates a timing diagram for operation of the capacitive charge measurement circuit of FIG. 3 with an asymmetric clock signal, according to an embodiment.

Drive module 310 is coupled with a sensor electrode, SE, and operates to drive sensor electrode SE, with a plurality of measurement cycles. A single measurement cycle is illustrated in FIG. 3, while multiple measurement cycles are illustrated in FIGS. 4 and 5. In one embodiment, sensor electrode SE may be any one or more of the transmitter electrodes 260 or any one or more of the receiver electrodes 270 that are illustrated in FIG. 2. Each measurement cycle of the plurality of measurement cycles is derived from a clock signal CLK. Clock signal CLK may be a symmetric clock signal, as illustrated in FIG. 4. Clock signal CLK may also be an asymmetric clock signal as illustrated in FIG. 5. In one embodiment, where CLK is an asymmetric signal, the low portion of the CLK signal may be shorter in duration than the high portion of the signal in order to take advantage of reset mechanism 320 which quickly discharges the capacitance under test, Cb, to return sensor electrode SE to a substantially constant voltage, such as system ground (or some offset therefrom). Although illustrated as being provided as an input to drive module 310, clock signal CLK may be generated within drive module 310 in some embodiments. Each measurement cycle drives sensor electrode SE between a first voltage level and a second voltage level; for example, between system ground and some voltage level that is offset by a predetermined amount from system ground. In the following description, while system ground and VDD may be mentioned, any two substantially constant voltages may be used, where the value of a first substantially constant voltage is lower than the value of the second substantially constant voltage.

Drive module 310, utilizes clock signal CLK as a first input to drive logic 314 (depicted as an AND gate). A second input to drive logic 314 is provided by a delay chain 312, in the form of a delayed version of clock signal CLK. When both clock and the delayed version of CLK are high, the measurement cycle that is output from delay chain 312 also goes high, the falling edge of clock signal CLK causes the measurement cycle to go low as well. Drive logic 314 drives the measurement cycle through resistor R1 onto sensor electrode SE. In another embodiment, delay chain 312 may comprise logic which is adjustable to increase or decrease the amount of delay introduced. Such adjustment may be under control of determination module 340 (e.g., via "n" delay selection bits) or another portion of processing system 110A.

Reset mechanism 320 operates to couple sensor electrode SE with a substantially constant voltage after the end of a measurement cycle and before the beginning of a next consecutive measurement cycle, of the plurality of measurement cycles driven by drive module 310. As non-limiting examples, the substantially constant voltage may be a system ground or some voltage offset by a predetermined amount from the system ground. As depicted in FIG. 3, reset mechanism 320 comprises a short delay 322, which receives clock signal CLK as an input and operates to introduce a short delay to clock signal CLK. The falling edge of the shortly delayed clock signal output from short delay 322 then triggers a pulse generator 324 which outputs a reset pulse that triggers closing of switch SW1. Short delay 322 may be implemented as a logic delay in one embodiment (e.g., cascaded logic gates). In another embodiment, short delay 322 may be implemented as another pulse generator. Pulse generator 324 may be implemented as an amplifier or buffer, in some embodiments. In some embodiments, switch SW1 may be implemented with a transistor such as the n-type field effect transistor shown in FIG. 3.

As illustrated in FIG. 3, pulse generator 324 generates a reset pulse which closes switch SW1 and briefly couples sensor electrode SE with a substantially constant voltage (e.g., system ground or some predetermined offset from system ground) to provide a reset signal. This causes sensor electrode SE to be quickly reset to this substantially constant voltage, rather than sensor electrode SE simply decaying to system ground or some other substantially constant voltage over a longer period of time as would happen without the intervention of reset mechanism 320. In FIG. 3, the pad signal illustrates charging of sensor electrode SE in response to the measurement signal and quick discharge in response to application of the reset signal. In one embodiment, duration of a low period of clock signal CLK is selected to correspond to a discharge rate of sensor electrode SE. As the reset, and thus discharge of sensor electrode SE, is forced by reset mechanism 320, measurement cycles may occur more frequently than if the reset of sensor electrode were not forced. Thus when reset mechanism 320 is utilized to shorten the discharge period of sensor electrode SE, duration of the low period may be shortened as compared to a situation where reset mechanism 320 is not utilized. This may allow for either a faster clock signal or the use of an asymmetric clock signal where the low portion of the clock signal has a shorter duration that the high portion of the clock signal.

Receiver module 330 is coupled with sensor electrode SE and operates to input a voltage from sensor electrode SE in response to receipt of clock signal CLK. An output of receiver module 330 provides an output signal of a first level in response to an input object interacting with and altering charge on sensor electrode SE. In this manner, a change in capacitive charge on sensor electrode SE can be measured and presence of an input object detected and measured. In various embodiments receiver module 330 may utilize or be implemented with a latched comparator, such as latched comparator 332. Herein, a generic latched comparator 332 is illustrated. However, it should be appreciated that other types of latched comparators such as a D flip-flop or a T flip-flop, as two examples, may be utilized. As illustrated in FIG. 3, latched input of latched comparator 332 is coupled with sensor electrode SE, clock signal CLK is coupled with clock input of latched comparator 332, and the output of latched comparator 332 is coupled with determination module 340. When a voltage that is input from sensor electrode SE is above a threshold, such as the input threshold voltage of the latched comparator 332, then the output of receiver module 332 is high, when below, it is low.

Determination module 340 effectively measures an occurrence of change in capacitance on sensor electrode SE, following each measurement cycle, by monitoring an output signal from receiver module 330. Logic 342 operates to produce a signal of n-bits to represent the amount of capacitance measured and to lengthen control a delay introduced by delay chain 312. In one embodiment, delay introduced by delay chain 312 may be lengthened in response to an output signal from receiver module 330 being high and shortened in response to an output signal from receiver module 330 being low. For example logic 342 may comprise a counter which is incremented when the output signal provided by receiver module 330 is high and decremented when the output signal from receiver module 330 is low. The n-bit signal progressively lengthens or shortens the delay until a steady state is reached where the output of receiver module 332 oscillates between high and low states. The same n-bit signal is also provided to digital filter 344, which filters this n-bit output signal of logic 342 and provides a filtered output signal, m-bits, reflecting the measured change in capacitance on sensor electrode SE. For example, in various embodiments, the value of the counter in n-bits which may be needed in order to reach a steady state of the output of receiver module 330 can be used to represent a measure of absolute capacitance of the capacitance under test, Cb, associated with sensor electrode SE as the result of an input object 140 interacting with a sensing region 120 generated by sensor electrode SE. As some non-limiting examples, in various embodiments, digital filter 344 may be implemented as one or some combination of: a boxcar filter, a sinc squared filter, a finite input response (FIR) filter, an infinite input response (IRR) filter, and a non-linear filter.

FIG. 4 illustrates a timing diagram 400 for operation of capacitive charge measuring circuit 300 of FIG. 3 with a symmetric clock signal. As illustrated in FIG. 4, the high and low durations of symmetric clock are substantially equal to one another. The measurement signal (which is also considered a drive signal) illustrated in timing diagram 400 has a rising edge which occurs slightly after the rising edge of the symmetric clock signal. The pad signal illustrates charging of sensor electrode SE (of FIG. 3) in response to the measurement signal and quick discharge in response to application of the reset signal. The measurement signal terminates with the falling edge of the symmetric clock signal. The reset signal goes high following a short delay period 410 after the falling edge of the symmetric clock signal. Short delay period 410 is introduced by short delay 322 of FIG. 3.

FIG. 5 illustrates a timing diagram 500 for operation of capacitive charge measuring circuit 300 of FIG. 3 with an asymmetric clock signal. As illustrated in FIG. 5, the high and low durations of asymmetric clock are of different durations from one another, with the low durations being much shorter than the high durations. The measurement signal (which is also considered a drive signal) illustrated in timing diagram 500 has a rising edge which occurs slightly after the rising edge of the asymmetric clock signal. The pad signal illustrates charging of sensor electrode SE (of FIG. 3) in response to the measurement signal and quick discharge in response to application of the reset signal. The measurement signal terminates with the falling edge of the asymmetric clock signal. The reset signal goes high following a short delay period 510 after the falling edge of the asymmetric clock signal. Short delay period 510 is introduced by short delay 322 of FIG. 3.

Figure 6:
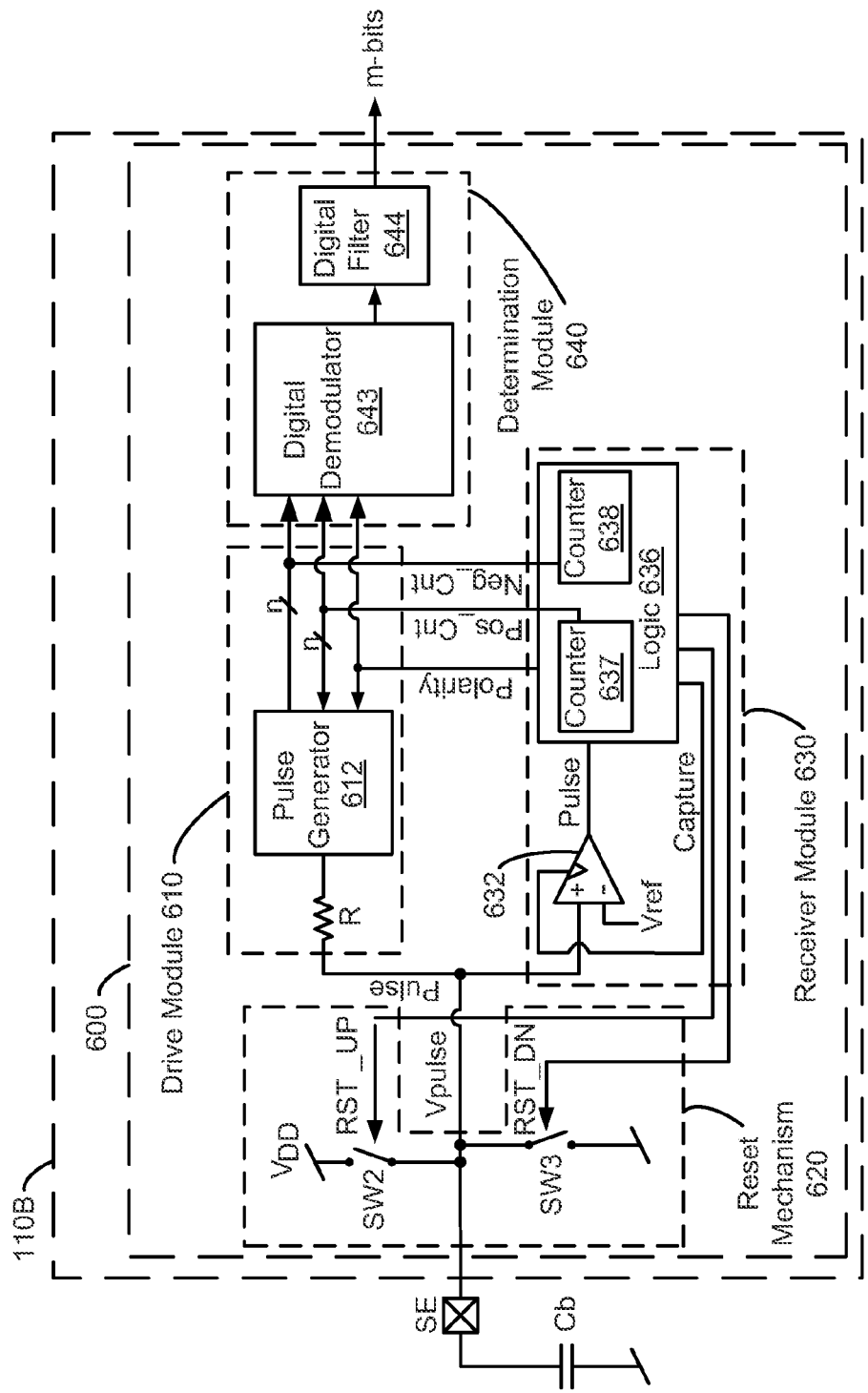
FIG. 6 shows a processing system with a capacitive charge measuring circuit, according to some embodiments.

FIG. 6 shows processing system 110B with a capacitive charge measuring circuit 600, according to some embodiments. Processing system 110B of FIG. 6, may be utilized with electronic device 100 of FIG. 1 to form a capacitive input device, and may be coupled with one or a plurality of sensor electrodes, such as, for example, the sensor electrodes illustrated in FIG. 2. As illustrated in FIG. 6, capacitive charge measuring circuit 600 includes a drive module 610, a reset mechanism 620, a receiver module 630, and a determination module 640. Measurements of a capacitance under test, Cb, conducted with circuit 600 are composed of largely independent, time interleaved pulse pass measurements in which, after sensor electrode SE is reset to a positive or negative state, a pulse is generated which causes sensor electrode SE to discharge.

Drive module 610 is coupled with a sensor electrode, SE, and operates to drive sensor electrode SE, with a plurality of positive and negative pulses, which represent and are referred to as measurement cycles. Pulse generator 612 generates these pulses for the measurement cycles and drives them onto sensor electrode SE, through a resistor R, in one embodiment. By way of example, and not of limitation, sensor electrode SE may represent any one or more of the transmitter electrodes 260 or the receiver electrodes 270 illustrated in FIG. 2. A positive measurement cycle drives sensor electrode SE between a first voltage level and a second voltage level, for example, from a high state such as VDD toward a first threshold voltage which is lower than VDD. A negative measurement cycle drives sensor electrode SE between a third voltage level and a fourth voltage level, for example, from a low state such as system ground toward a second threshold voltage which is higher than system ground. In some embodiments, the first and second threshold voltages may be the same as one another, such as an input threshold voltage associated with a component of receiver module 630 (e.g., an input threshold for the input of latched comparator 632). In other embodiments, the threshold voltage may be dynamically set by processing system 110, and it is possible that the first and second thresholds may be selected to be different from one another.

Reset mechanism 620 is coupled with sensor electrode SE and operates to reset sensor electrode SE to one of two states. For example, as part of a positive measurement cycle a "reset up" (RST_UP in FIG. 6 and FIG. 7) signal is received from logic 636, switch SW2 is closed and sensor electrode SE is reset to a substantially constant voltage such as $V_{DD}$; and as part of a negative measurement cycle a "reset down" (RST_DN in FIG. 6 and FIG. 7) signal is received from logic 636, switch SW3 is closed and sensor electrode SE is reset to a substantially constant voltage such as system ground. Only one of switches SW2 and SW3 is closed at time. Switches SW2 and SW3 may be implemented in any fashion, but in one embodiment are implemented utilizing transistors. For example, in one embodiment, SW2 is implemented with a p-type field effect transistor while SW3 is implemented with an n-type field effect transistor. In another embodiment, switches SW2 and SW3 can be replaced by placing a pass gate across resistor R of pulse generator 612.

A pulse generated by pulse generator 612 is delayed and is opposite in polarity to a state to which sensor electrode SE has been reset by reset mechanism 620. This effectively causes sensor electrode SE to discharge through pulse generator 612 when a pulse is applied as part of a positive or negative measurement cycle.

Although a single resistor R is illustrated in drive module 610, resistor R may be replaced with two resistors of different value that are arranged in parallel, in order to speed up measurements. In such an embodiment, either the lower valued resistor or both resistors would be selected and used to drive the pulse signal for a set amount of time, and then only the higher valued resistor would be utilized for final driving of sensor electrode SE with a pulse; this causes initial discharge of sensor electrode SE to occur quickly, and then final measurement to be performed with greater resolution at a lower discharge rate. Resistor R may be replaced by both a current source and a current sink, where an appropriate one of the current source and current sink is selected according to the polarity of a measurement cycle being made with sensor electrode SE. For example, for a rising pulse in a measurement cycle (negative measurement cycle), the current source is selected and for a falling pulse in the measurement cycle (positive measurement cycle), the current sink is selected. When the current source/sink are made ratiometric with the power supply for a capacitive input device, then an improvement in power supply rejection ratio is realized by capacitive charge measuring circuit 600. In a similar fashion to the use of two resistors in place of resistor R to speed measurements, a two-level current source and a two-level current sink may also be utilized instead of a single level current source and a single level current sink.

Receiver module 630 is coupled with sensor electrode SE and operates to input a voltage from sensor electrode SE. For example, at the end of a pulse, and in response to receipt of the rising edge of a "capture" signal provided by logic 636, a voltage, Vpulse, is input from sensor electrode SE. An output of receiver module 630 is based on level of the input Vpulse, and provides an output signal of a first level in response to Vpulse being at or above a threshold voltage and an output signal of a second level in response to Vpulse being below the threshold voltage. In this manner, a change in capacitive charge on sensor electrode SE can be measured, and presence of an input object detected. In various embodiments receiver module 630 may a utilize a latched comparator, such as latched comparator 632 to latch in a voltage. Herein, a generic latched comparator 632 is illustrated. However, it should be appreciated that other types of latched comparators such as a D flip-flop or a T flip-flop, as two examples, may be utilized. As illustrated in FIG. 6, the latched input of latched comparator 632 is coupled with sensor electrode SE; the "capture signal" is coupled with clock input of latched comparator 632; and the output of latched comparator 632 provides an output signal, Pulse, that is coupled with logic 636. Logic 636 includes a first counter 637 and a second counter 638. Counter 637 is set based on the first and additional output signals, Pulse, produced in response to the first and additional Vpulse voltages captured as input during a first and additional positive measurement cycles. For example, a high value of Pulse during a positive measurement cycle causes a count, Pos_Cnt, of counter 637 to be incremented, while a low value of Pulse during a positive measurement cycle causes Pos_Cnt to be decremented by logic 636. Counter 638 is set based on the first and additional output signals, Pulse, produced in response to the first and additional Vpulse voltages captured as input during a first and additional negative measurement cycles. For example, a low value of Pulse during a negative measurement cycle causes a count, Neg_Cnt, of counter 638 to be incremented, while a high value of Pulse during a negative measurement cycle causes Neg_Cnt to be decremented by logic 636. Pos_Cnt and Neg_Cnt are designed not to decrement below zero and may also be configured with a maximum value which they cannot be incremented beyond.

As depicted in FIG. 6, logic 636 outputs a polarity signal to drive module 610 and to determination module 640. The polarity signal indicates whether a positive or negative measurement cycle is being accomplished. In one embodiment, the polarity signal is a symmetric signal, which substantially equally interleaves the positive and negative measurement cycles. However, in various embodiments, the positive and negative measurement cycles may not be required to be strictly interleaved, and two or more positive measurement cycles and/or two or more negative measurement cycles may be sequentially accomplished in order to spread a spectral response of circuit 600.

An increased Pos_Cnt value received by pulse generator 612 will cause the next pulse generated by drive module 610 during a positive measurement cycle to be increased by a predetermined unit of time, such that discharge time of sensor electrode SE will be slightly longer during the next positive measurement cycle. An increased Neg_Cnt value received by pulse generator 612 will cause the next pulse generated by drive module 610 during a negative measurement cycle to be increased by a predetermined unit of time, such that charge time of sensor electrode SE will be slightly longer during the next negative measurement cycle. Positive and negative measurement cycles can be repeated until a steady state of Pos_Cnt and Neg_Cnt or reached and/or until a predetermined amount of time has passed. In absence of interference, a steady state of Pos_Cnt occurs when the count value of Pos_Cnt continually cycles back and forth between being incremented and decremented during consecutive positive measurement cycles. In absence of interference, a steady state of Neg_Cnt occurs when the count value of Neg_Cnt continually cycles back and forth between being incremented and decremented during consecutive negative measurement cycles.

Determination module 640 operates to produce a demodulated output signal, m-bits, based on the outputs (Pos_Cnt and Neg_Cnt) of counter 637 and counter 638. For example digital demodulator 643 effectively measures an occurrence of change in capacitance on sensor electrode SE, following each measurement cycle, by monitoring a change in the Pos_Cnt during a positive measured cycle and a change in Neg_Cnt during a negative measurement cycle. In one embodiment, digital demodulator 643 combines the values of positive and negative count, such as by subtracting them. Through combination, any slow disturbance (e.g., 60 Hz interference) can be eliminated, as it should lengthen (or shorten) Pos_Cnt by the same amount that it lengthens (or shortens) Neg_Cnt. There are various manners in which digital demodulator 643 can operate to combine the values of Pos_Cnt and Neg_Cnt. For example, in one embodiment, digital demodulator 643 keeps a rolling sum in which each Pos_Cnt is added to the previous Neg_Cnt and each Neg_Cnt is added to the previous Pos_Cnt.

In various embodiments, determination module 640 operates to indicate that interference is present or that a measured capacitance is invalid if either or both of Pos_Cnt or Neg_Cnt fail to settle to a steady state within a predetermined period of time or else reach their maximum value. In such an embodiment, when interference or an invalid measurement is suspected, digital demodulator 643 may refrain from providing an output to digital filter 644 for filtering and outputting as m-bits.

Digital filter 644 operates to filter a demodulated signal received from digital demodulator 643. One or more of a variety of filters may be employed by digital filter 644 including, but not limited to: a boxcar filter, a sinc squared filter, a finite input response (FIR) filter, an infinite input response (IRR) filter, and a non-linear filter.

By measuring capacitance on a plurality of sensor electrodes, determination module 640 or other portion of processing system 110 can further operate to determine positional information with respect to an input object interacting with sensing region of a capacitive input device. By way of example, and not of limitation, reference is made to FIG. 2, and it is noted that by independently scanning and measuring an absolute capacitance on each of transmitter electrodes 260 and on each of receiver electrodes 270 over a short period of time, determination module 640 can determine the positional information of an input object, such as input object 140, with respect to a sensing region 120 generated by sensor electrode pattern 200 of FIG. 2.

Figure 7:
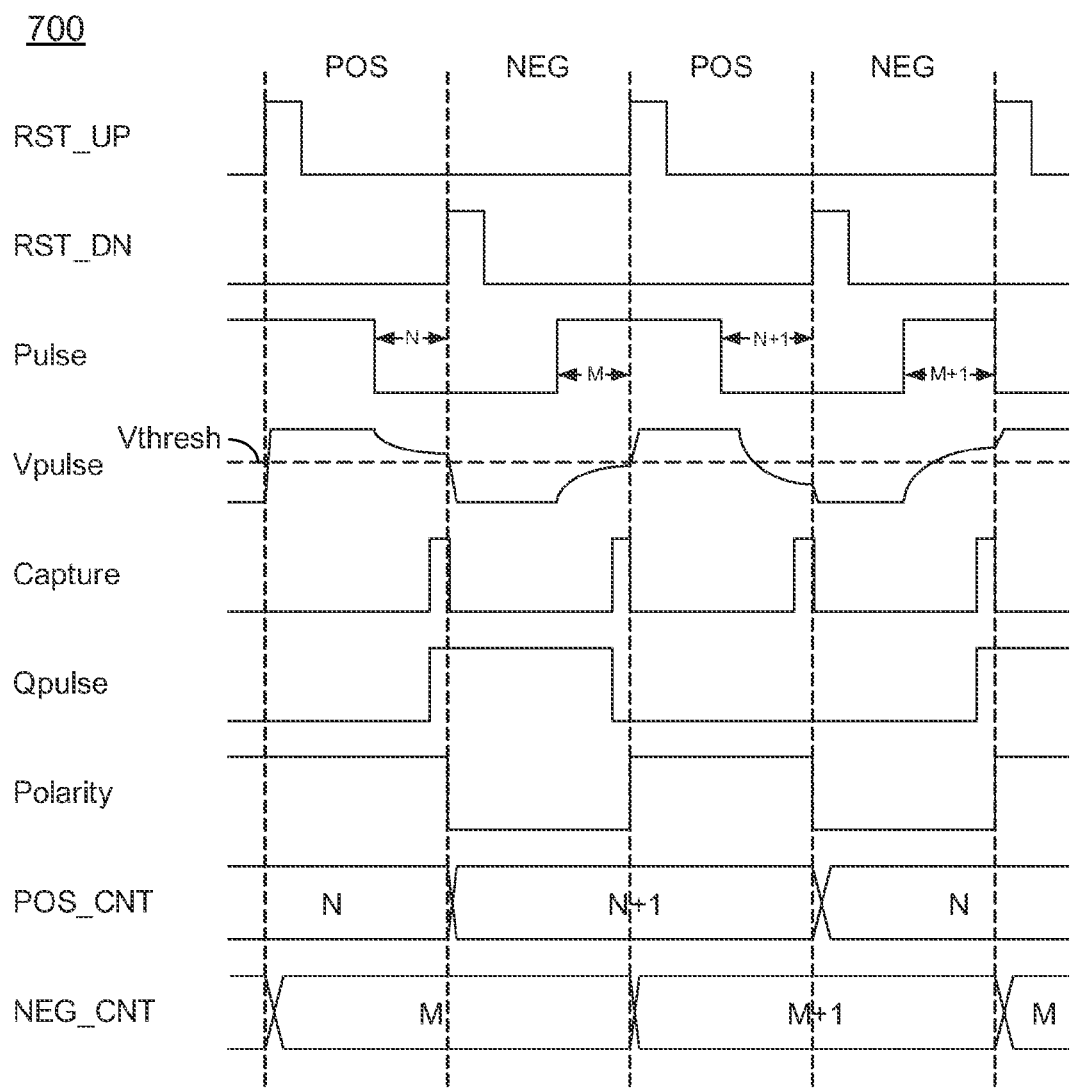
FIG. 7 illustrates a timing diagram for operation of the capacitive charge measuring circuit of FIG. 6, according to an embodiment.

FIG. 7 illustrates a timing diagram 700 for operation of capacitive charge measuring circuit 600 of FIG. 6. A number of positive measurement cycles (POS) and negative measurement cycles (NEG) are illustrated. In the first positive measurement cycle, starting at the upper left of timing diagram 700, a RST_UP signal is provided which causes sensor electrode SE to be driven to a voltage such as VDD; the RST_DN signal remains inactive. A Pulse is provided after a the RST_UP signal is turned off. Pulse causes a Vpulse (voltage on sensor electrode SE) to discharge toward Vthresh (a threshold voltage as previously described). After a predetermined time of discharge, a Capture signal causes receiver module 630 to input a value of Vpulse. The value of Vpulse is above the threshold voltage, so Pulse goes high. The Polarity signal is set to high through this positive measurement cycle, indicating that the measurement cycle is a positive measurement cycle. Pos_Cnt is incremented from N to N+1 as result of the high Pulse, and will cause Pulse to be N+1 units long during the next positive measurement cycle. As illustrated, during the next positive measurement cycle, Vpulse is discharged below Vthresh, and Pos_Cnt is decremented. In the first negative measurement cycle, starting at the upper left of timing diagram 700 in the second column, a RST_DN signal is provided which causes sensor electrode SE to be driven to a voltage such as system ground; the RST_UP signal remains inactive. A Pulse signal is provided after a the RST_DN signal is turned off. Pulse causes a Vpulse (voltage on sensor electrode SE) to charge toward Vthresh After a predetermined time of discharge, a Capture signal causes receiver module 630 to input a value of Vpulse. The value of Vpulse is slightly below the threshold voltage, so Pulse goes low. The Polarity signal is set to low through this negative measurement cycle, indicating that the measurement cycle is a negative measurement cycle. Neg_Cnt is incremented from M to M+1 as result of the high Pulse, and will cause Pulse to be M+1 units long during the next negative measurement cycle. As illustrated, during the next positive measurement cycle, Pulse is M+1 units long; Vpulse is charged above Vthresh; and Neg_Cnt is decremented.

Although in timing diagram 700 there is a timespan between the end of RST_UP and the beginning of Pulse, and similarly between the end of RST_DN and the beginning of Pulse, these timespans can be shortened by extending RST_UP and RST_DN until the start of Pulse. Such an embodiment would provide a low-impedance path for interference, thus increasing attenuation.

Figure 8A:
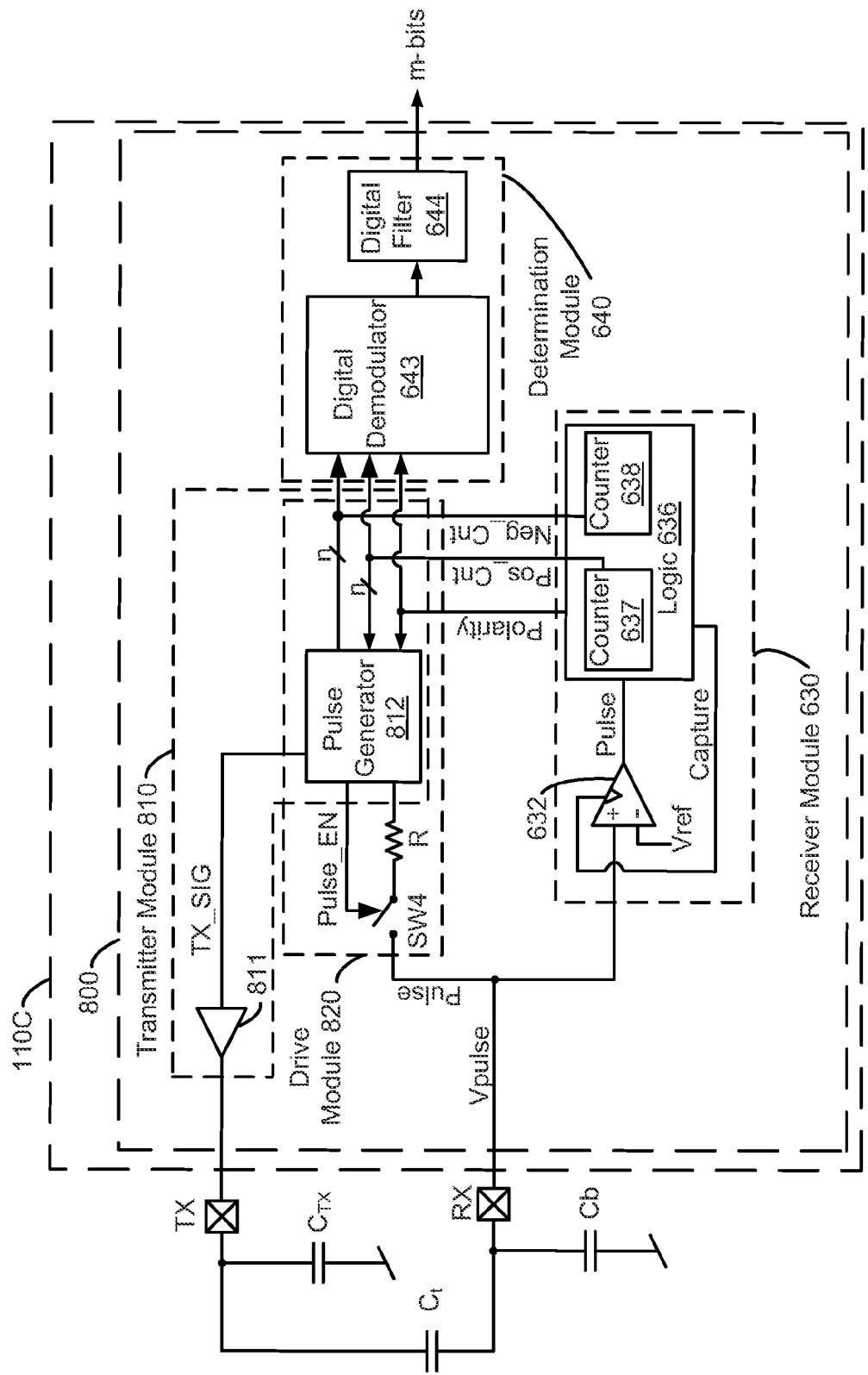
FIG. 8A shows a processing system with a transcapacitive charge measuring circuit, according to some embodiments.

FIG. 8A shows processing system 110C with a transcapacitive charge measuring circuit 800, according to some embodiments. Processing system 110C of FIG. 8A, may be utilized with electronic device 100 of FIG. 1 to form a capacitive input device, and may be coupled with a plurality of sensor electrodes, such as, for example, various combinations of transmitter and receiver electrode pairs illustrated in FIG. 2. As illustrated in FIG. 8A, capacitive charge measuring circuit 800 includes a transmitter module 810, a drive module 820, a receiver module 630, and a determination module 640. Although some additional description is provided below, it should be noted that receiver module 630, and determination module 640 operate very similarly to the manner previously described in conjunction with FIG. 6 except that, due to configuration of circuit 800, a change in capacitive coupling (transcapacitance) between a transmitter electrode and a receiver electrode is measured rather than an absolute capacitance.

Measurements of a transcapacitance, Ct, between a transmitter electrode TX and a receiver electrode RX that are conducted with circuit 800 rely on charge being transferred through the trans-capacitance, Ct, being measured. To achieve this, the voltage on the transmitter electrode TX is changed while the voltage on the receiver electrode RX is held constant. In on embodiment, the measurement made is then the measurement of charge that may be required to keep the voltage constant on receiver electrode RX.

Transmitter module 810 is coupled with a transmitter electrode, TX, of a capacitive input device and operates to drive the transmitter electrode with a plurality of positive and negative measurement cycles. A positive measurement cycle drives transmitter electrode TX between a first voltage level and a second voltage level, while a negative measurement cycle drives transmitter electrode TX between the second voltage level and the first voltage level. By way of example, and not of limitation, transmitter electrode TX may represent any one or more of the transmitter electrodes 260 illustrated in FIG. 2. Transmitter module 810 includes pulse generator 812 and amplifier 811. Pulse generator 812 provides a digital output, TX_SIG that is buffered or amplified by amplifier 811. This digital output drives transmitter electrode TX from a first substantially constant voltage (e.g., system ground) to a second substantially constant voltage (e.g., VDD) for a positive measurement cycle and from the second substantially constant voltage (e.g., VDD) to the first substantially constant voltage (e.g., system ground) for a negative measurement cycle.

$C_{TX}$ is the capacitance associated with transmitter electrode TX, while Cb is the capacitance associated with receiver electrode RX. It should be appreciated that the background capacitance $C_{TX}$ associated with transmitter electrode TX may slightly slow the transitions between a first and second substantially constant voltage, and vice-a-versa, but is otherwise irrelevant due to being driven by a low impedance. A transmitter transition induces a voltage change, Vpulse, at receiver electrode RX. The value of Vpulse can be determined according to Equation 1.

$$\Delta V_{pulse} = \Delta V_{TX} \frac{C_t}{C_t + C_b} \qquad \text{EQUATION 1}$$

In various embodiments, the charge, q, that may be required to counteract the voltage change induced at receiver electrode RX can be determined according to Equation 2.

$$q = -\Delta V_{pulse}(C_t + C_b) = \qquad\qquad \text{EQUATION 2}$$
$$-\Delta V_{TX}\frac{C_t}{C_t + C_b}(C_t + C_b) = -\Delta V_{TX}C_t$$

Drive module 820 is coupled with a receiver electrode, RX, and operates to drive receiver electrode RX with a substantially constant voltage, such as system ground or VDD. By way of example, and not of limitation, receiver electrode RX may represent any one or more of the receiver electrodes 270 illustrated in FIG. 2. Drive module 820 includes pulse generator 812 which generates a voltage, Pulse, which is coupled to receiver electrode RX through resistor R for the length of time that a pulse enable signal (Pulse_EN in FIGS. 8A and 9) closes switch SW4. As previously described in conjunction with description of resistor R in FIG. 6, resistor R in FIG. 8A may be replaced, in some embodiments, with multiple resistors in parallel or with a combination of a current source and a current sink. As will be further described below, drive module 820 operates to increase or decrease charge on receiver electrode RX based on count values (Pos_Cnt and Neg_Cnt) of counters 637 and 638. For example, drive module 820 increases charge on receiver electrode RX when a count value of Pos_Cnt from counter 637 is positive; and also increases charge when count value of Neg_Cnt from counter 638 is negative. Drive module 820 decreases charge on receiver electrode RX when a count value of Pos_Cnt from counter 637 is negative; and also decreases charge when count value of Neg_Cnt from counter 638 is positive.

For both the positive and negative measurement cycles, Pos_Cnt and Neg_Cnt may be considered as signed values, in some embodiments. When considered as signed values, the magnitude of the value determines the length of Pulse and the sign of the value determines the polarity of Pulse. In other embodiments, Pos_Cnt and Neg_Cnt may be treated as unsigned values and the polarity of Pulse is determined by the type of measurement cycle (e.g., a positive or negative measurement cycle). When Pos_Cnt and Neg_Cnt are treated as unsigned values, the polarity of a measurement cycle may be indicated and/or controlled by the Polarity output of receiver module 630.

During a positive measurement cycle, transmitter module 810 transitions transmitter electrode TX from a first substantially constant voltage to a second substantially constant voltage, the second higher than the first. In one embodiment, transmitter module 810 transitions TX from system ground to VDD. Pulse generator 812 enables Pulse for a length associated with the magnitude of Pos_Cnt. If Pos_Cnt is positive Pulse is set to system ground (removing charge) and if negative, set to VDD (adding charge). At the end of Pulse being enabled, the voltage on the receiver electrode RX is captured by receiver module 630 and compared to a first threshold. In various embodiments the first threshold may be dynamically set or associated with an existing threshold, such as the input threshold voltage of receiver module 630. For example, in response to a Capture signal provided by logic 636 to the clock input of latched comparator 632, voltage Vpulse is input. When the voltage, Vpulse, is below the input threshold of receiver module 630, the output, Pulse, from latched comparator 632 goes low and Pos_Cnt of counter 637 is decremented, shortening the next Pulse during a positive measurement cycle and removing less charge. If Vpulse is above the input threshold, the output, Pulse, from latched comparator 632 goes low, and Pos_Cnt of counter 637 is incremented, lengthening the next Pulse during a positive measurement cycle and removing more charge.

During a negative measurement cycle, transmitter module 810 transitions transmitter electrode TX from a second substantially constant voltage to a first substantially constant voltage, the second higher than the first. In one embodiment, transmitter module 810 transitions TX from VDD to system ground. Pulse generator 812 enables Pulse for the length of the magnitude of Neg_Cnt. If Neg_Cnt is positive, Pulse is set to VDD (adding charge) and if negative, Pulse is set to system ground (removing charge). At the end of Pulse being enabled, the voltage on the receiver electrode RX is captured by receiver module 630 and compared to a second threshold which may be the same or different from the first threshold. In various embodiments the second threshold may be dynamically set or associated with an existing threshold, such as the input threshold voltage of receiver module 630. For example, in response to a Capture signal provided by logic 636 to the clock input of latched comparator 632, voltage Vpulse is input. If the voltage, Vpulse, is below the input threshold of receiver module 630, the output, Pulse, from latched comparator 632 goes low and Neg_Cnt is incremented, lengthening the next pulse and adding more charge. If Vpulse is above the input threshold, the output, Pulse, from latched comparator 632 goes high, and Neg_Cnt of counter 637 is decremented, shortening the next Pulse during a negative measurement cycle and removing less charge.

Receiver module 630, of FIG. 8A, is coupled with receiver electrode RX and operates to input a voltage, Vpulse, from receiver electrode RX. In other aspects, receiver module 630 of FIG. 8A operates in a very similar fashion to the previous description in conjunction with FIG. 6. For example, at the end of a Pulse, and in response to receipt of the rising edge of a "capture" signal provided by logic 636, a voltage, Vpulse, is input from receiver electrode RX. An output of receiver module 630 is based on level of the input Vpulse, and provides an output signal of a first level in response to Vpulse being at or above a threshold voltage and an output signal of a second level in response to Vpulse being below the threshold voltage. In various embodiments receiver module 630 may a utilize a latched comparator, such as latched comparator 632 to latch in a voltage, Vpulse. Herein, a generic latched comparator 632 is illustrated. However, it should be appreciated that other types of latched comparators such as a D flip-flop or a T flip-flop, as two examples, may be utilized. As illustrated in FIG. 8A, the latched input of latched comparator 632 is coupled with receiver electrode RX; the "capture signal" is coupled with clock input of latched comparator 632; and the output of latched comparator 632 provides an output signal, Pulse, that is coupled with logic 636. Logic 636 includes a first counter 637 and a second counter 638. Counter 637 is set based on the first and additional output signals, Pulse, produced in response to the first and additional Vpulse voltages captured as input during a first and additional positive measurement cycles. For example, a high value of Pulse during a positive measurement cycle causes a count, Pos_Cnt, of counter 637 to be incremented, while a low value of Pulse during a positive measurement cycle causes Pos_Cnt to be decremented by logic 636. Counter 638 is set based on the first and additional output signals, Pulse, produced in response to the first and additional Vpulse voltages captured as input during a first and additional negative measurement cycles. For example, a low value of Pulse during a negative measurement cycle causes a count, Neg_Cnt, of counter 638 to be incremented, while a high value of Pulse during a negative measurement cycle causes Neg_Cnt to be decremented by logic 636.

An increased Pos_Cnt value received by pulse generator 612 will cause the next Pulse_EN generated by drive module 820 during a positive measurement cycle to be increased by a predetermined unit of time, such that Pulse will be enabled slightly longer during the next positive measurement cycle; a decrease in Pos_Cnt has the opposite effect. An increased Neg_Cnt value received by pulse generator 612 will cause the next Pulse_EN generated by drive module 820 during a negative measurement cycle to be increased by a predetermined unit of time, such that Pulse will be enabled slightly longer during the next negative measurement cycle; a decrease in Neg_Cnt has the opposite effect. Positive and negative measurement cycles can be repeated until a steady state of Pos_Cnt and Neg_Cnt or reached and/or until a predetermined amount of time has passed. In absence of interference, a steady state of Pos_Cnt occurs when the count value of Pos_Cnt continually cycles back and forth between being incremented and decremented during consecutive positive measurement cycles. In absence of interference, a steady state of Neg_Cnt occurs when the count value of Neg_Cnt continually cycles back and forth between being incremented and decremented during consecutive negative measurement cycles.

Determination module 640 operates to produce a demodulated output signal, m-bits, based on the outputs (Pos_Cnt and Neg_Cnt) of counter 637 and counter 638. For example digital demodulator 643 effectively measures an occurrence of change in capacitance on sensor electrode RX, following each measurement cycle, by monitoring a change in the Pos_Cnt during a positive measured cycle and a change in Neg_Cnt during a negative measurement cycle. In one embodiment, digital demodulator 643 combines the values of positive and negative count, such as by adding them together. Through combination, any slow disturbance (e.g., 60 Hz interference) can be eliminated, as it should lengthen (or shorten) Pos_Cnt by the same amount that it lengthens (or shortens) Neg_Cnt. There are various manners in which digital demodulator 643 can operate to combine the values of Pos_Cnt and Neg_Cnt. For example, in one embodiment, digital demodulator 643 keeps a rolling sum in which each Pos_Cnt is added to the previous Neg_Cnt and each Neg_Cnt is added to the previous Pos_Cnt.

In various embodiments, determination module 640 operates to indicate that interference is present or that a measured capacitance is invalid if either or both of Pos_Cnt or Neg_Cnt fail to settle to a steady state within a predetermined period of time or else reach their maximum value. In such an embodiment, when interference or an invalid measurement is suspected, digital demodulator 643 may refrain from providing an output to digital filter 644 for filtering and outputting as m-bits.

Digital filter 644 operates to filter a demodulated signal received from digital demodulator 643. One or more of a variety of filters may be employed by digital filter 644 including, but not limited to: a boxcar filter, a sinc squared filter, a finite input response (FIR) filter, an infinite input response (IRR) filter, and a non-linear filter.

By measuring capacitance on a plurality of sensor electrodes, determination module 640 or other portion of processing system 110 can further operate to determine positional information with respect to an input object interacting with sensing region of a capacitive input device. By way of example, and not of limitation, reference is made to FIG. 2, and it is noted that by independently scanning and measuring transcapacitances between combinations of transmitter electrodes 260 and receiver electrodes 270 over a short period of time, determination module 640 can generate transcapacitive values for a plurality of capacitive pixels (e.g., similar to capacitive pixel 290) which are used to determine the positional information of an input object, such as input object 140, with respect to a sensing region 120 generated by sensor electrode pattern 200 of FIG. 2.

In various embodiments a reset mechanism is coupled with sensor electrode RX and operates to reset sensor electrode to at least one of two states. For example, sensor electrode RX may be coupled to a first substantially constant voltage (VDD, system ground or any other voltage value) through a switch. The receiver may be reset to that voltage between measurement cycles by closing the switching. In another example the sensor electrode RX may be coupled to two or more substantially constant voltages and configured to be coupled to a first substantially constant voltage as part of a positive measurement cycle and to a second substantially constant voltage as part of a negative measurement cycle. In one embodiment, the first substantially constant voltage is VDD and the second substantially constant voltage is system ground. In another embodiment, the first substantially constant voltage is any voltage greater than the second substaptially constant voltage.

Figure 8B:
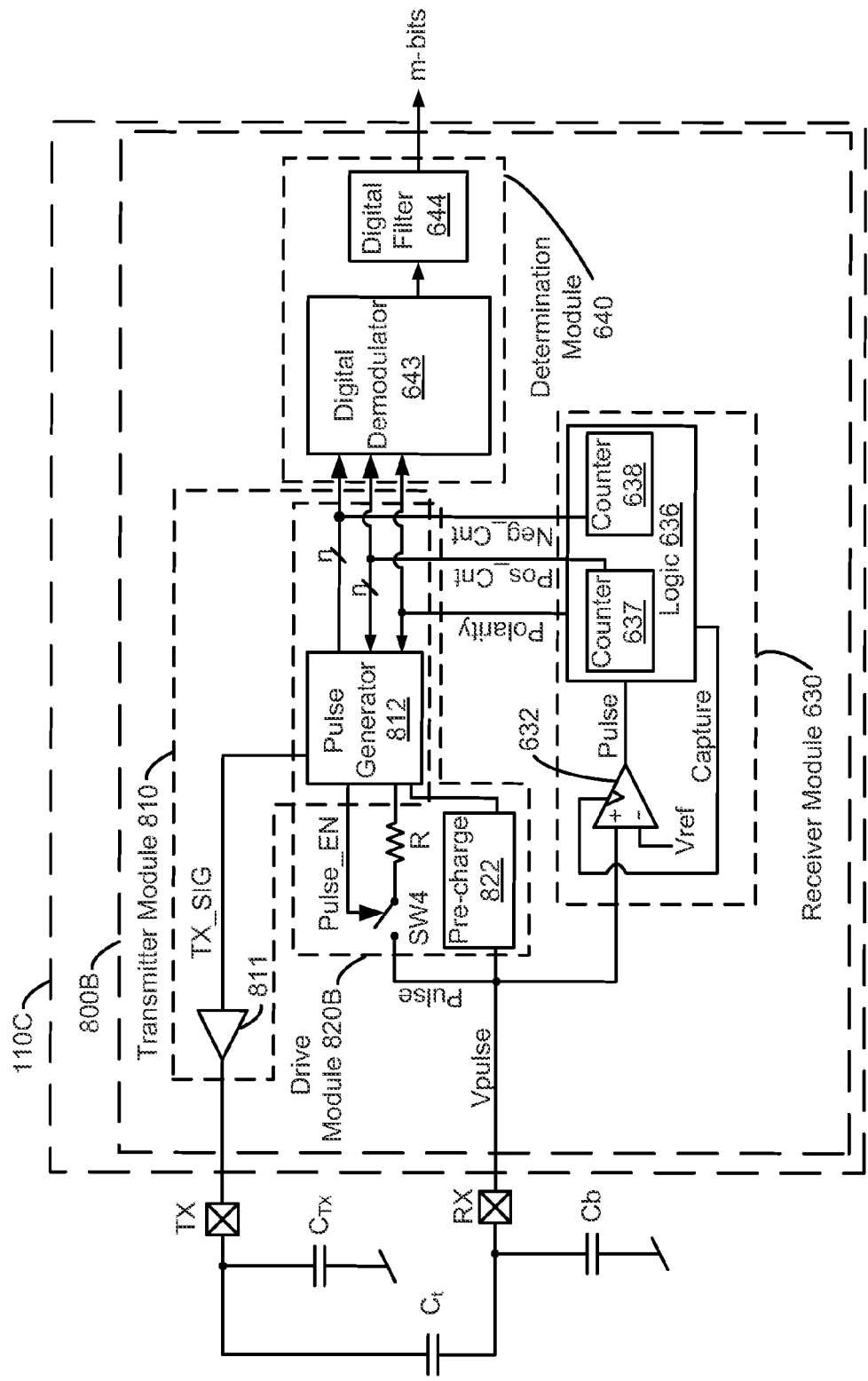
FIG. 8B shows a processing system with a transcapacitive charge measuring circuit, according to some embodiments.

FIG. 8B shows processing system 110C with a transcapacitive charge measuring circuit 800B, according to some embodiments. Circuit 800B includes a slight variation on circuit 800, but otherwise operates in an identical fashion. In circuit 800B, drive module 820 is replaced by drive module 820B. Drive module 820B includes pre-charge 822 which operates to pre-charge receiver electrode RX to a predetermined voltage between positive and negative measurement cycles. In some embodiments, the predetermined voltage is the input threshold voltage of receiver module 630. Pre-charge 822 may be implemented in any number of fashions. For example, pre-charge 822 may comprise a switch and a resistive divider connected to VDD and system ground; a transistor divider connected to VDD and system ground; an amplifier, or any other source of low impedance voltage. In one embodiment, pre-charge 822 may be implemented by inserting an inverter before the input of latched comparator 632. During the pre-charge cycle, the output of the inverter would be shorted to the input of the inverter. This pre-charges receiver electrode RX to the input threshold of the inverter and therefore, the effective input threshold of latched comparator 632. In one embodiment, when pre-charge 822 is utilized, a single-sided measurement of transcapacitance may be made, that is, only positive measurement cycles or only negative measurement cycles would be performed. In those embodiments, when single-sided measurements are made, only one of counters 637 and 638 may be required.

Figure 9:
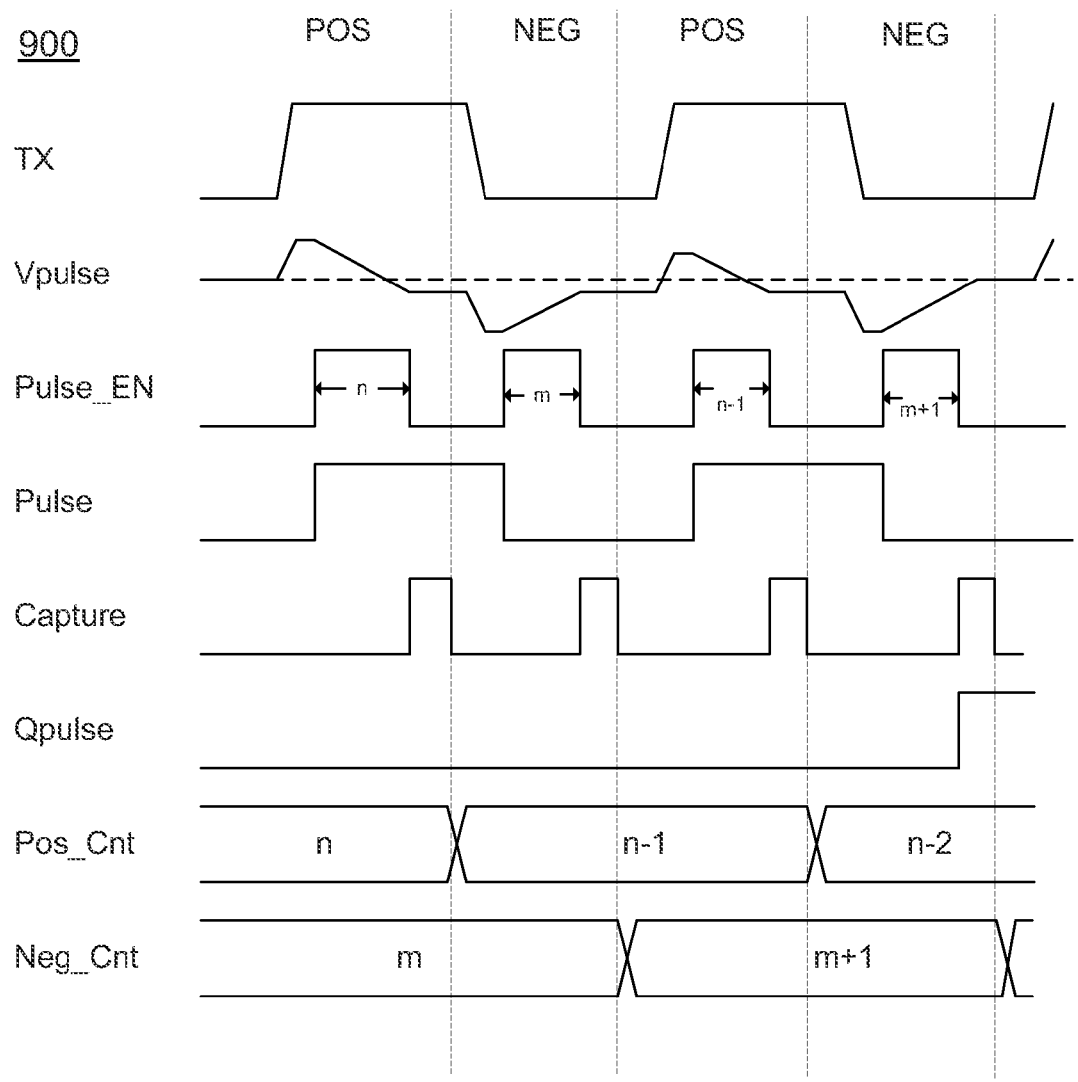
FIG. 9 illustrates a timing diagram for operation of the transcapacitive charge measurement circuit of FIG. 8A, according to an embodiment.

FIG. 9 illustrates a timing diagram 900 for operation of transcapacitive charge measuring circuit 800 of FIG. 8A. A number of positive measurement cycles (POS) and negative measurement cycles (NEG) are illustrated. In the first positive measurement cycle, starting at the upper left of timing diagram 900, transmitter module 810 transitions transmitter electrode TX from a low state (e.g., system ground) to a high state (e.g., VDD), while Pulse is enabled for a time period, n, for which Pulse_EN is high; and a Capture signal provided by logic 636 causes receiver module 630 to input a voltage Vpulse from receiver electrode RX. As Vpulse is below a threshold voltage (represented by the horizontal dashed line) Pulse is low, causing Pos_Cnt of counter 637 to be decremented, and thus decreasing the time period to n−1 that Pulse_EN is high during the next positive measurement cycle. In the second positive measurement cycle, Vpulse is still below the threshold voltage meaning that Pos_Cnt will be decremented again and that Pulse_EN will be high for a period of n−2 during a third positive measurement cycle (not depicted). Moving rightward in timing diagram 900 to the first negative positive measurement cycle, transmitter module 810 transitions transmitter electrode TX from a high state (e.g., VDD) to a low state (e.g., system ground), while Pulse is enabled for a time period, m, for which Pulse_EN is high; and a Capture signal provided by logic 636 causes receiver module 630 to input a voltage Vpulse from receiver electrode RX. As Vpulse is below a threshold voltage (represented by the horizontal dashed line), Pulse is low causing Neg_Cnt of counter 638 to be incremented, and thus increasing the time period to m+1 that Pulse_EN is high during the next negative measurement cycle. During the second negative measurement cycle, Vpulse is at the threshold voltage, causing Pulse to go high, meaning that Neg_Cnt is decremented and that in the next negative measurement cycle Pulse_EN will be set to a time period of m.

Although in timing diagram 900, the Capture signals are depicted as rising at the falling edge of the Pulse_EN signals, in many embodiments this may not be required. Instead, in some embodiments, the Capture signals may be delayed for some period of time after the falling edge of the Pulse_EN signals.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. A circuit for measuring a change in capacitive coupling between a transmitter electrode and receiver electrode, said circuit comprising:
    a transmitter module configured for coupling with said transmitter electrode of a capacitive input device, said transmitter module configured to drive said transmitter electrode with a plurality of positive and negative measurement cycles, wherein a positive measurement cycle drives said transmitter electrode between a first voltage level and a second voltage level, and wherein a negative measurement cycle drives said transmitter electrode between said second voltage level and said first voltage level;
    a latched comparator, wherein said latched comparator comprises:
        an input configured for coupling with said receiver electrode of said capacitive input device and, upon enablement, configured for determining if voltages from said receiver electrode satisfy an input threshold of said latched comparator, wherein said voltages correspond with said positive and negative measurement cycles; and
        an output configured for providing latched comparator outputs based upon said determining;
    a first counter wherein said first counter is incremented based on a first output value of said latched comparator output, wherein said first output value corresponds to a determination that a first voltage of said voltages satisfies said input threshold, and wherein said first voltage of said voltages corresponds to a positive measurement cycle of said plurality of positive and negative measurement cycles; and
    a second counter, wherein said second counter is decremented based on a output value of said latched comparator output, wherein said second output value corresponds to a determination that a second voltage of said voltages satisfies said input threshold, and wherein said second voltage corresponds to a negative measurement cycle of said plurality of positive and negative measurement cycles, and wherein said measurement of said change in capacitive coupling between said transmitter electrode and receiver electrode is based on counter values of said first and second counters.

2. The circuit of claim 1, further comprising:
    a determination module configured to produce a demodulated output signal based on said first counter value and said second counter value.

3. The circuit of claim 2, wherein said determination module is further configured to determine positional information for an input object based on said demodulated output signal.

4. The circuit of claim 2, wherein said determination module comprises a filter for filtering said output signal.

5. The circuit of claim 1, further comprising a drive module configured to drive said receiver electrode with a substantially constant voltage.

6. The circuit of claim 5, wherein said drive module is configured to increase charge on said receiver electrode based on count values of said first and second counters.

7. The circuit of claim 6, wherein said drive module is configured to increase charge on said receiver electrode when a count value of said first counter is positive and a count value of said second counter is negative.

8. The circuit of claim 7, wherein said count values of said first and second counters determine a length of time which for said drive module drives said receiver electrode with said constant voltage.

9. The circuit of claim 5, wherein said drive module is configured to decrease charge on said receiver electrode based on count values of said first and second counters.

10. The circuit of claim 9, wherein said drive module is configured to decrease charge on said receiver electrode when a count value of said first counter is negative and a count value of said second counter is positive.

11. A processing system for a transcapacitive input device comprising a transmitter electrode and a receiver electrode, said processing system comprising:
    a transmitter module configured for coupling with said transmitter electrode of a capacitive input device, said transmitter module configured to drive said transmitter electrode with a plurality of positive and negative measurement cycles, wherein a positive measurement cycle drives said transmitter electrode between a first voltage level and a second voltage level, and wherein a negative measurement cycle drives said transmitter electrode between said second voltage level and said first voltage level;
    a receiver module comprising:
        an input configured for coupling with said receiver electrode of said capacitive input device and, upon enablement, configured for determining if voltages from said receiver electrode satisfy an input threshold of said receiver module, wherein said voltages correspond with said positive and negative measurement cycles; and
        wherein said receiver module is configured to increment or decrement a first counter value based on value of a first voltage during a positive measurement cycle, and wherein said receiver module is configured to increment or decrement a second counter value based on a value of a second voltage during a negative measurement cycle; and a determination module configured to produce a demodulated output signal based on said first counter value and said second counter value.

12. The processing system of claim 11, further comprising a drive module coupled with said receiver electrode and configured to drive said receiver electrode with a constant voltage.

13. The processing system of claim 12, wherein said drive module is further configured to pre-charge said receiver electrode.

14. The processing system of claim 11, wherein said determination module is further configured to determine positional information for an input object based on said demodulated output signal.

15. The processing system of claim 11, wherein said receiver module is configured to compare the first and second voltages to respective first and second thresholds and set said first counter value and second counter value based on those comparisons:
   wherein said first counter is incremented when said first voltage exceeds said first threshold and decremented when said first voltage is below said first threshold; and
   wherein said second counter is incremented when said second voltage is below said second threshold and decremented when said second voltage exceeds said second threshold.

16. A capacitive input device comprising:
   a plurality of sensor electrodes comprising a transmitter electrode and a receiver electrode; and
   a transmitter module configured for coupling with said transmitter electrode, said transmitter module configured to drive said transmitter electrode with a plurality of positive and negative measurement cycles, wherein a positive measurement cycle drives said transmitter electrode between a first voltage level and a second voltage level, and wherein a negative measurement cycle drives said transmitter electrode between said second voltage level and said first voltage level
   a receiver module comprising:
      an input configured for coupling with said receiver electrode of said capacitive input device and, upon enablement, configured for determining if voltages from said receiver electrode satisfy an input threshold of said receiver module, wherein said voltages correspond with said positive and negative measurement cycles; and
      wherein said receiver module is configured to increment or decrement a first counter value based on value of a first voltage during a positive measurement cycle, and wherein said receiver module is configured to increment or decrement a second counter value based on a value of a second voltage during a negative measurement cycle; and
   a determination module configured to produce a demodulated output signal based on said first counter value and said second counter value.

17. The capacitive input device of claim 16, further comprising a drive module coupled with said receiver electrode and configured to drive said receiver electrode with a constant voltage.

18. The capacitive input device of claim 17, wherein said drive module is further configured to pre-charge said receiver electrode.

19. The capacitive input device of claim 16, wherein said determination module is further configured to determine positional information for an input object based on said demodulated output signal.

20. The capacitive input device of claim 16, wherein said receiver module is configured to compare the first and second voltages to respective first and second thresholds and set said first counter value and second counter value based on those comparisons;
   wherein said first counter is incremented when said first voltage exceeds said first threshold and decremented when said first voltage is below said first threshold; and
   wherein said second counter is incremented when said second voltage is below said second threshold and decremented when said second voltage exceeds said second threshold.

* * * * *